United States Patent
Kim et al.

(10) Patent No.: US 6,624,665 B2
(45) Date of Patent: Sep. 23, 2003

(54) CMOS SKEWED STATIC LOGIC AND METHOD OF SYNTHESIS

(75) Inventors: Chulwoo Kim, Austin, TX (US); Sung-Mo Kang, Santa Cruz, CA (US)

(73) Assignee: The Board of Trustees of the University of Illinois, Urbana, IL (US)

(*) Notice: Subject to any disclaimer, the term of this patent is extended or adjusted under 35 U.S.C. 154(b) by 0 days.

(21) Appl. No.: 10/141,255

(22) Filed: May 8, 2002

(65) Prior Publication Data

US 2002/0175712 A1 Nov. 28, 2002

Related U.S. Application Data

(60) Provisional application No. 60/292,399, filed on May 21, 2001.

(51) Int. Cl.[7] .............................................. H03K 19/96
(52) U.S. Cl. .......................... 326/95; 326/98; 326/104; 326/106
(58) Field of Search .............................. 326/93, 95, 98, 326/104, 106, 108

(56) References Cited

U.S. PATENT DOCUMENTS 6,133,762 A * 10/2000 Hill et al. .................... 326/119
6,140,836 A * 10/2000 Fujii et al. ..................... 326/35

OTHER PUBLICATIONS

Chulwoo Kim, Kiwook Kim, and Sung–Mo (Steve) Kang, "Energy–Efficient Skewed Static Logic Design with Dual Vt," in *IEEE*, May, 2001 pp. IV–882–885.
Chulwoo Kim, Jaesik Lee, Kwang–Hyun Baek, Eric Martina, and Sung–Mo (Steve) Kang, "High–Performance, Low–Power Skewed Static Logic in Very Deep–submicron (VDSM) Technology," Sep., 2000, pp. 59–64.

Chulwoo Kim, Jaesik Lee, Kwang–Hyun Baek and Sung–Mo (Steve) Kang, "Low–Power Skewed Static Logic ($S^2L$) with Topology–Dependent Dual Vt," Sep., 2000, pp. 310–314.
Gin Yee and Carl Sechen, "Clock–Delayed Domino for Adder and Combinational Logic Design," *IEEE International Conference on Computer Design*, 1996, pp. 332–337.
V. Sundararajan and K. Parhi, "Low Power Synthesis of Dual Threshold Voltage CMOS VLSI Circuits," in *IEEE International Symp. on Low Power Electronics and Design*, Jun., 1999, pp. 139–144.
V. De and S. Borkar, "Technology and Design Challenges for Low Power and High Performance," in *IEEE International Symp. on Low Power Electronics and Design*, Jun., 1999, pp. 163–168.
T. Thorp, G. Yee, and C. Sechen, "Monotonic Static CMOS and Dual Vt Technology," in *IEEE International Symp. on Low Power Electronics and Design*, Jun., 1999, pp. 151–155.

(List continued on next page.)

*Primary Examiner*—Michael Tokar
*Assistant Examiner*—Vibol Tan
(74) *Attorney, Agent, or Firm*—Greer, Burns & Crain, Ltd.

(57) ABSTRACT

A new CMOS skewed static logic gate is provided having a logic function circuit and a positive feedback or accelerator circuit. The skewed gate uses a plurality of transistors matched and joined as a plurality of separate gate inputs to form the logic function circuit and the accelerator circuit. The accelerator circuit, which connects to an output of the logic function circuit, provides acceleration to the evaluation performed by the logic function circuit. The logic function circuit includes an evaluation path connected to a set of output transistors that connect to transistors of the accelerator circuit. The evaluation path includes a stacked set of low threshold voltage ($V_t$) transistors, which have a lower $V_t$ than the set of output transistors. The output transistors are configured to receive a first input signal to precharge an output of the CMOS skewed static logic gate prior to the skewed gate receiving a second input signal.

19 Claims, 7 Drawing Sheets

OTHER PUBLICATIONS

S. Mutoh, et al., "1–V Power Supply High–Speed Digital Circuit Technology with Multithreshold–Voltage CMOS," in *IEEE J. Solid–State Circuits*, vol. 30, No. 8, pp. 847–854, Aug. 1995.

L. Wei, Z. Chen, K. Roy, M. Johnson, Y. Ye, and V. De, "Design and Optimization of Dual–Threshold Circuits for Low–Voltage Low–Power Applications," in *IEEE Trans. VLSI Syst.*, vol. 7, No. 1, pp. 16–24, Mar. 1999.

C. Kim, S. O. Jung, K. H. Baek, and S. M. Kang, "Parallel Dynamic Logic (PDL) with Speed–enhanced Skewed Static (SSS) Logic," in *IEEE International Symp. on Circuits and Systems*, May, 2000, pp. 756–759.

S. M. Kang and Y. Leblebici, CMOS Digital Integrated Circuits Analysis and Design, 2nd ed., McGraw–Hill, 1999, pp 376–378.

D. Harris and M. Horowitz, "Skew–Tolerant Domino Circuits," in *IEEE J. Solid–State Circuits*, vol. 32, No. 11, pp. 1702–1711, Nov. 1997.

R. Puri, A. Bjorksten and T. E. Rosser, "Logic Optimization by Output Phase Assignment in Dynamic Logic synthesis," in *IEEE/ACM International Workshop Logic Synthesis*, pp. 2–8, May 1997.

A. Jain and R. K. Bryant, "Inverter Minimization in Multi–Level Logic Networks," in *IEEE/ACM Int. Conf. Computer Aided Design*, 1993, pp. 462–465.

L. G. Heller, W. R. Griffin, J. W. Davis and N. G. Thomas, "Cascode Voltage Switch Logic: A Differential CMOS Logic Family," in *IEEE J. Solid–State Circuits*, vol. 19, pp. 16–17, Jun. 1984.

N.F. Goncalves and H. J. de Mari, "NORA: a Racefree Dynamic CMOS Technique for Pipelined Logic Structures," in *IEEE J. Solid–State Circuits*, vol. 18, pp. 261–266, Jun. 1983.

R. H. Krambeck, et al., "High–Speed Compact Circuits with CMOS," in *IEEE J. Solid–State Circuits*, vol. SC–17, pp. 614–619, Jun. 1982.

\* cited by examiner

CMOS SKEWED STATIC LOGIC AND METHOD OF SYNTHESIS

CROSS-REFERENCE TO RELATED APPLICATIONS

The present Application claims priority under Title 35 U.S.C. §119 on copending Provisional Patent Application Serial No. 60/292,399, filed May 21, 2001.

FIELD OF THE INVENTION

The field of the invention is CMOS logic. The invention finds particular use in CMOS microprocessor circuits.

BACKGROUND OF THE INVENTION

CMOS logic gates are fundamental components of microprocessor circuits. Much effort is still placed in the design of logic gate families. Static CMOS logic gates offer simple cascading, but exhibit slow response. Dynamic logic gates that have precharge and evaluation operations controlled by a clock signal often cannot be cascaded directly. A dynamic gate output precharged to either a high or low logic level can cause improper charge operation of its next stage dynamic gate, leading to an erroneous evaluation result. If logic evaluation is through NMOS transistors of a gate, inputs for that gate should be precharged to a low logic level "L" to prevent unintended discharge. If PMOS, then precharge should be the high logic level "H" to prevent unintended charge up. If the input logic level is "X" during precharge and the output is denoted "Y", gates may only be cascaded if Y(i)=X(j), where i<j and i, j denote the cascaded stage numbers.

Domino logic has been the logic family of choice for high-speed circuits in state-of-the-art processors such as Pentium Pro and Alpha. Domino logic circuits overcome the intrinsically slow nature of conventional static CMOS circuits, which is caused by the need for each gate to drive both NMOS and PMOS transistors. Domino logic circuits drive only NMOS transistors, thereby offering faster speed and smaller area compared to conventional static CMOS circuits.

Domino logic circuits have an inherently non-inverting nature, require strict timing constraints, and have a charge sharing problem. Domino logic with inverting and non-inverting outputs has been devised, but have their own set of problems.

NORA (NO RAce) circuits generate inverting logic only through strict cascading of NMOS and PMOS dynamic gates. Dual-rail logic circuits provide both inverting and non-inverting outputs, but occupy about twice the area of a standard domino gate. The extra power consumption of the dual-rail logic gates is also a serious drawback.

Some of these problems were addressed by Yee and Sechen, "Clock-Delayed Domino for Adder and Combinational Logic Design," IEEE (Pub. No. 1063-6404/96)(1996). Clock-delayed domino (CD domino) eliminates the fundamental monotonic signal requirement by propagating a clock signal with controlled delay in parallel to the logic. However, the clock delay scheme is difficult to implement in practice. The clock delay must be large enough to allow evaluation of the slowest gates. Controlling this delay while satisfying the conflicting need for high-speed logic is a difficult task. The delay is set equal to the worst case pull-down delay of the corresponding dynamic gate, with an added margin for differences in signal delay, coupling parasistics, and fabrication process variations. Minimizing the set delay is thus difficult.

CD domino is also sensitive to process variations. In addition, it requires additional circuitry that takes up area and consumes power. Specifically, extra precharge transistors and a keeper PMOS transistor are used to reduce the effects of charge sharing, noise and coupling parasitics. Each CD domino gate typically requires a clock-delay logic device.

Figure 1A:
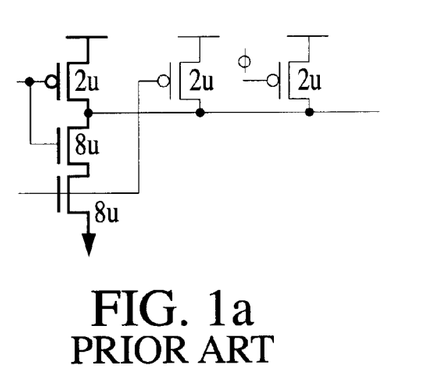
Figure 1B:
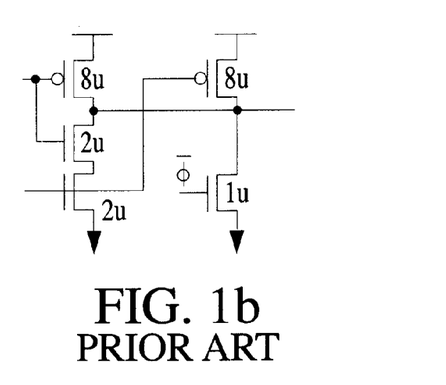
Figure 1C:
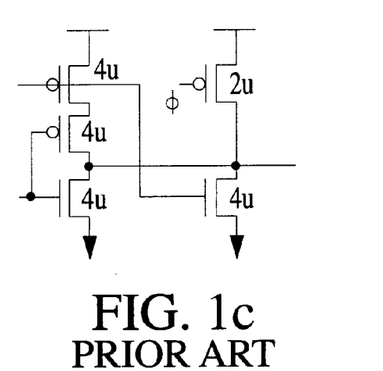
Figure 1D:
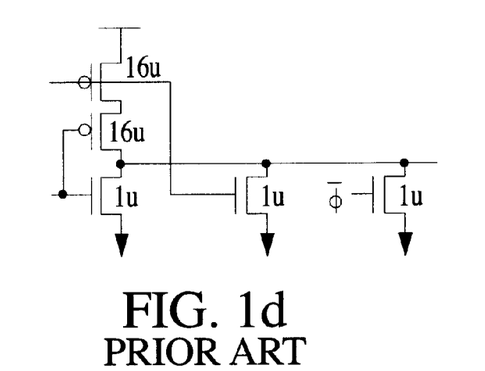
Figure 2:
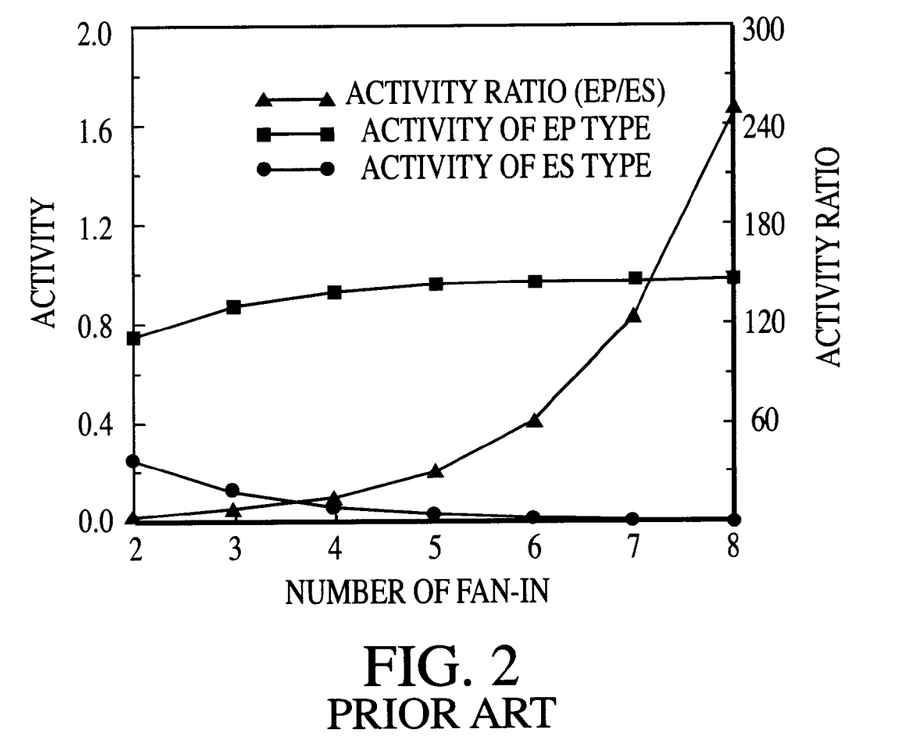
FIG. 2 is a plot of activity ratio illustrating the effects of parallel evaluation transistors.

MS (monotonic static) CMOS has a dynamic evaluation path that can consist of either parallel-connected transistors or serially connected transistors. MS CMOS has both low-skewed and high-skewed NAND and NOR gates. A low skewed NAND gate is shown in FIG. 1(a), a high skewed NAND gate in FIG. 1(b), a low skewed NOR gate in FIG. 1(c), and a high skewed NOR gate in FIG. 11(d). The trip point of low skewed gates is lower than Vdd/2. The trip point of high skewed gates is higher than Vdd/2. In application of MS CMOS, high fan-in and high skewed gates are preferred for high-speed evaluation operation. Due to the parallel evaluation of low skewed NOR and high skewed NAND, their activity increases exponentially compared to serial evaluation type gates. An activity ration may be defined in terms of the number of inputs as:

$$\text{Activity Ratio} = \frac{\alpha(EP)}{\alpha(ES)} = 2^n - 1$$

where, α is the activity, EP is the number of parallel evaluations and ES is the number of serial evaluations. FIG. 2 plots (in a solid line) the activity ratio, which increases drastically with the number of inputs due to the parallel evaluation. FIG. 2 reveals that an 8-input low skewed NOR gate or high skewed NAND gate, both parallel evaluation gates, transits 255 times more than corresponding serial evaluation gates. Dynamic power consumption increases dramatically in proportion to α.

MS CMOS also has significant static power consumption due to the parallel evaluation transistors. Leakage current in parallel-connected transistors with low threshold voltage causes large static power consumption in very deep submicron (VDSM) technology.

SUMMARY OF THE INVENTION

In the present invention, a CMOS gate is constructed with a logic function circuit and a positive feedback circuit. The positive feedback circuit, connected to an output of the logic function circuit, provides acceleration to the evaluation performed by logic function circuit. A trip point of the logic function circuit is deviated from Vdd/2 to provide fast transition.

A separate feature of the invention relates to the formation of large integrated circuits using the CMOS gates of the invention. Preferred circuits formed from CMOS gates of the invention implement a dual threshold voltage transistor (dual $V_t$) configuration of the invention. The dual $V_t$ aspect of the invention is applied according to the topology of transistors used in a given evaluation path. Low $V_t$ devices are only used for transistors in stacked transistor portions of evaluation paths. More stacked transistors can be used by application of the CMOS gates of a preferred embodiment of the invention, since the preferred embodiment for a NAND gate and a NOR gate receive a precharging clock signal (Clk) or an inverted clock signal ($Clk^{-1}$) to precharge output and internal feedback nodes of the NAND/NOR gates.

BRIEF DESCRIPTION OF THE DRAWINGS

Other features, advantages and objects of the invention will be apparent to those skilled in the art with reference to the detailed description, and the drawings, of which:

FIG. 1(*a*) shows a conventional low skewed NAND gate;

FIG. 1(*b*) shows a conventional high skewed NAND gate;

FIG. 1(*c*) shows a conventional low skewed NOR gate;

FIG. 1(*d*) shows a conventional high skewed NOR gate;

FIG. 3(*a*) shows a preferred embodiment NOR gate of the present invention;

FIG. 3(*b*) shows a preferred embodiment NAND gate of the present invention;

FIG. 4(*a*) shows an OR gate mapping methodology of the present invention;

FIG. 4(*b*) shows an AND gate mapping methodology of the present invention;

FIG. 6(*a*) shows an exemplary circuit prior to mapping;

FIG. 6(*b*) shows the exemplary circuit of FIG. 6(*a*) as a mapped circuit; and

FIG. 6(*c*) shows the mapped circuit of FIG. 6(*b*) with cancelled inverter pairs.

DETAILED DESCRIPTION OF THE PREFERRED EMBODIMENTS

Figure 3A:
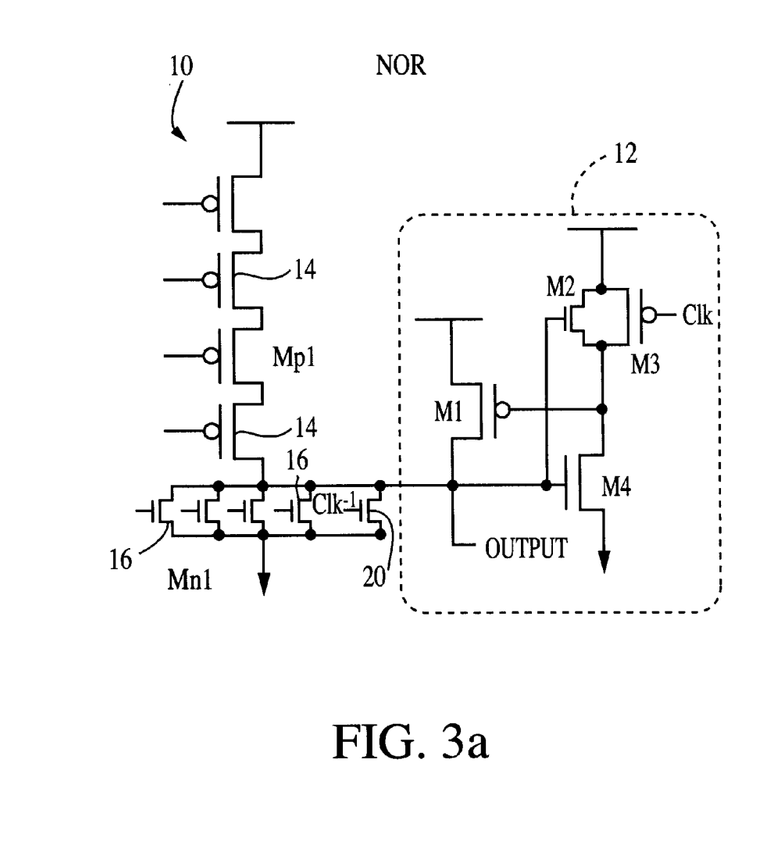
Figure 3B:
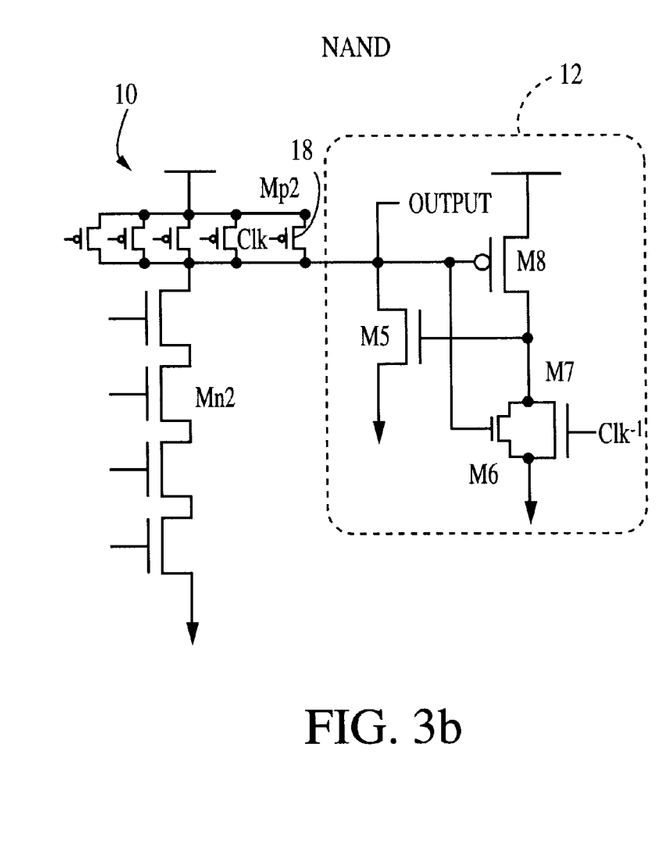

The invention is based upon output accelerated skewed static logic gates. With reference to FIGS. 3(*a*) and 3(*b*), which respectively show a preferred embodiment NOR gate and a preferred embodiment NAND gate, skewed static logic gates of the invention include a logic function circuit 10 and a positive feedback or accelerator circuit 12. Low threshold voltage devices (low $V_t$) are used in a topology dependent fashion. In the skewed static logic of the invention, the possible evaluation conduction paths are fixed. Low $V_t$ transistors are used only for transistors in stacked transistors in evaluation paths of the logic function circuit 10. Due to the positive feedback circuit 12, skewed state logic of the invention permits smaller sized Mp1s and Mn2s transistors than compared to MS CMOS. Accordingly, the skewed static logic of the invention imposes smaller input capacitance.

Stacked transistors 14 (Mp1's and Mn2's) with inputs fanned out to parallel-connected transistors 16 (Mn1's and Mp2's) form the logic circuit 10 of the skewed static logic gates in FIGS. 3(*a*) and 3(*b*). In the NOR gate the NMOS transistors are smaller than the PMOS transistors, while in the NAND gate the NMOS transistors are larger than the PMOS transistors. The NOR and NAND gates are skewed CMOS static circuits having a trip point deviated from Vdd/2 for fast transition. Topology dependence to place low $V_t$ transistors only in stacked evaluation paths may be accomplished with the Mn1 and Mp2 transistors being smaller than respective Mp1 and Mn2 transistors.

The plurality of Mp PMOS transistors in each case are matched and joined with a plurality of the Mn NMOS transistors as a plurality of separate gate inputs with the PMOS transistors being larger than the NMOS transistors in the case of the NOR gate and the opposite being true in the case of the NAND gate. An output signal is provided from the smaller (and higher $V_t$) parallel-connected transistors in each gate at an output node of the accelerator circuit 12. The accelerator circuit 12 enhances output speed through positive feedback of the output.

In FIGS. 3(*a*) and 3(*b*), transistors M1, M4, M5, and M8 connected to respective gate outputs provide positive feedback assisted by precharge transistors M3 and M7 (also connected to respective gate outputs). Precharge transistor M3 and a Mp2 transistor 18 are fed a clock signal (Clk) from related circuitry (not shown). The related circuitry also preferably feeds an inverted clock signal ($Clk^{-1}$) to precharge transistor M7 and a Mn1 transistor 20. Although an inverted clock signal is preferred, other embodiments having clock pulses with phase differences other than 180° between the Clk and $Clk^{-1}$ are contemplated and are within the scope of the present invention. For a NOR gate, the Mn1 transistor receives a first input inverted clock signal, and the M3 transistor receives a second input clock signal. For a NAND gate, the Mp2 transistor receives a first input clock signal, and the M7 transistor receives a second input inverted clock signal. Transistors M2 and M6 act to suppress noise and ensure stable operation by preventing the gate output from floating. The positive feedback M1, M4, M5, and M8 transistors can be high $V_t$ transistors and form respective loops connected to the outputs. The respective precharge transistors M3 and M7 can also be high $V_t$ transistors and are connected to the loop.

To reduce the leakage current while maintaining high-speed during the evaluation phase, topology-dependent low threshold voltage transistors (i.e., the four Mp1 transistors in FIG. 3(*a*), or the four Mn2 low threshold transistors in FIG. 3(*b*) are used in the evaluation paths. The use of low threshold voltage transistors in the evaluation paths (i.e., Mp1's and Mn2's) is advantageous since dynamic circuits have associated problems such as leakage current induced charge loss which can cause malfunction of the circuit. In the current design, speed degradation by the stacked transistors Mp1's, Mn2's is compensated for by the accelerator circuit 12 of the respective NOR/NAND gate. Moreover, the accelerator circuit 12 allows more stack transistors to be used, which results in significant energy savings. That is, since the output nodes of the NOR/NAND skewed static logic circuits are driven by accelerator circuits, the sizes of Mp1 and Mn2 do not need to be increased as much as monostatic CMOS circuits to prevent circuit malfunction. In particular, for an N-input stack topology, the skewed static logic circuits have an improved width to length (W/L) ratio due to two evaluation paths. This improved (W/L) ratio reduces the output load capacitance of the NOR/NAND skewed static logic circuits. Moreover, the effectiveness of the skewed static logic circuits will be greater for high fan in as well as high fan out circuit configurations.

Figure 4A:
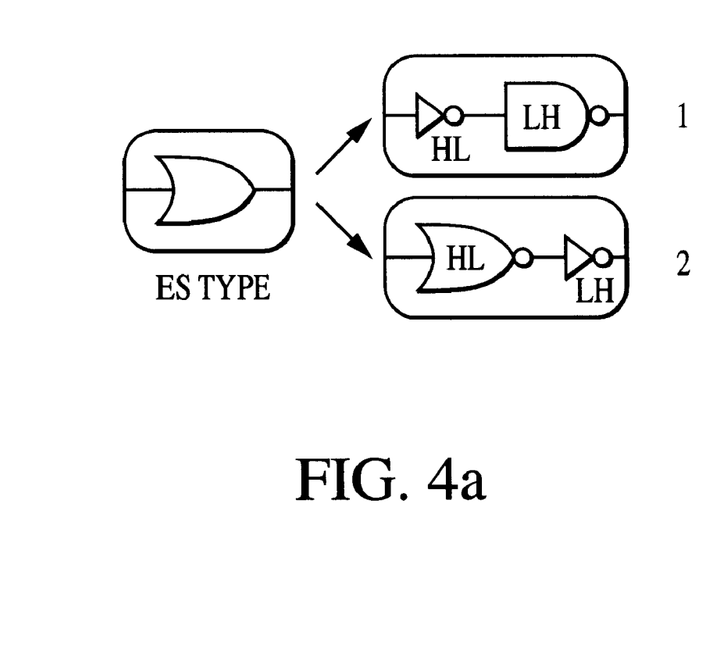
Figure 4B:
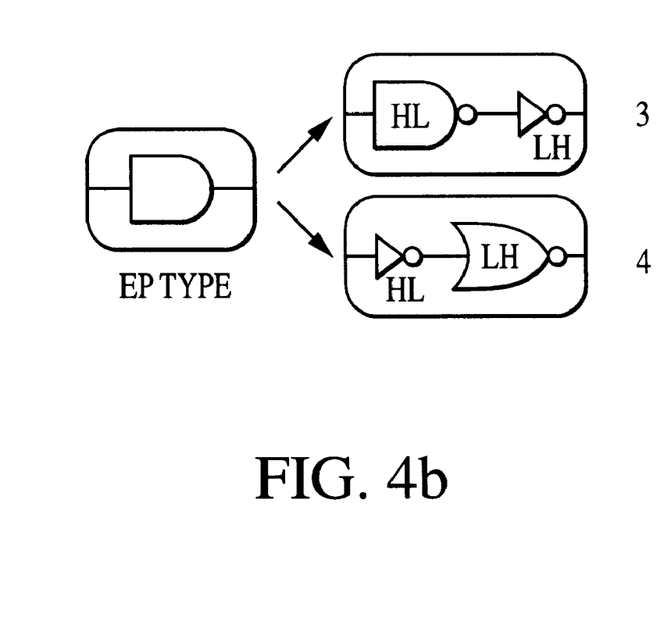

The inherent monotonic property of skewed static logic requires a circuit configuration which does not contain inverting logic which occurs from circuit components such as inverters, NAND gates, and NOR gates. To eliminate inverting logic from a circuit topology, a process of technology mapping or synthesis of the circuit can be implemented. FIGS. 4(*a*)–(*b*) illustrate technology mapping of an OR gate and an AND gate according to the process disclosed in FIG. 5. In FIG. 4(*a*), ES type or serial connected transistors can be mapped into configuration 1 gates with an inverter feeding into a NAND gate, or alternatively into a configuration 2 gate, with a NOR gate feeding into an inverter. Similarly, in FIG. 4(*b*) an EP type gate consisting of parallel connected transistors can be mapped into a NAND gate inputted into an inverter as a configuration 3 gate, or an inverter inputted into a NOR gate as a configuration 4 gate. The classification of configurations is motivated by inverter cancellation which is dependent on circuit topology and which reduces inverting logic in the CMOS skewed static logic circuit due to inverters, NAND gates, and NOR gates.

Figure 5:
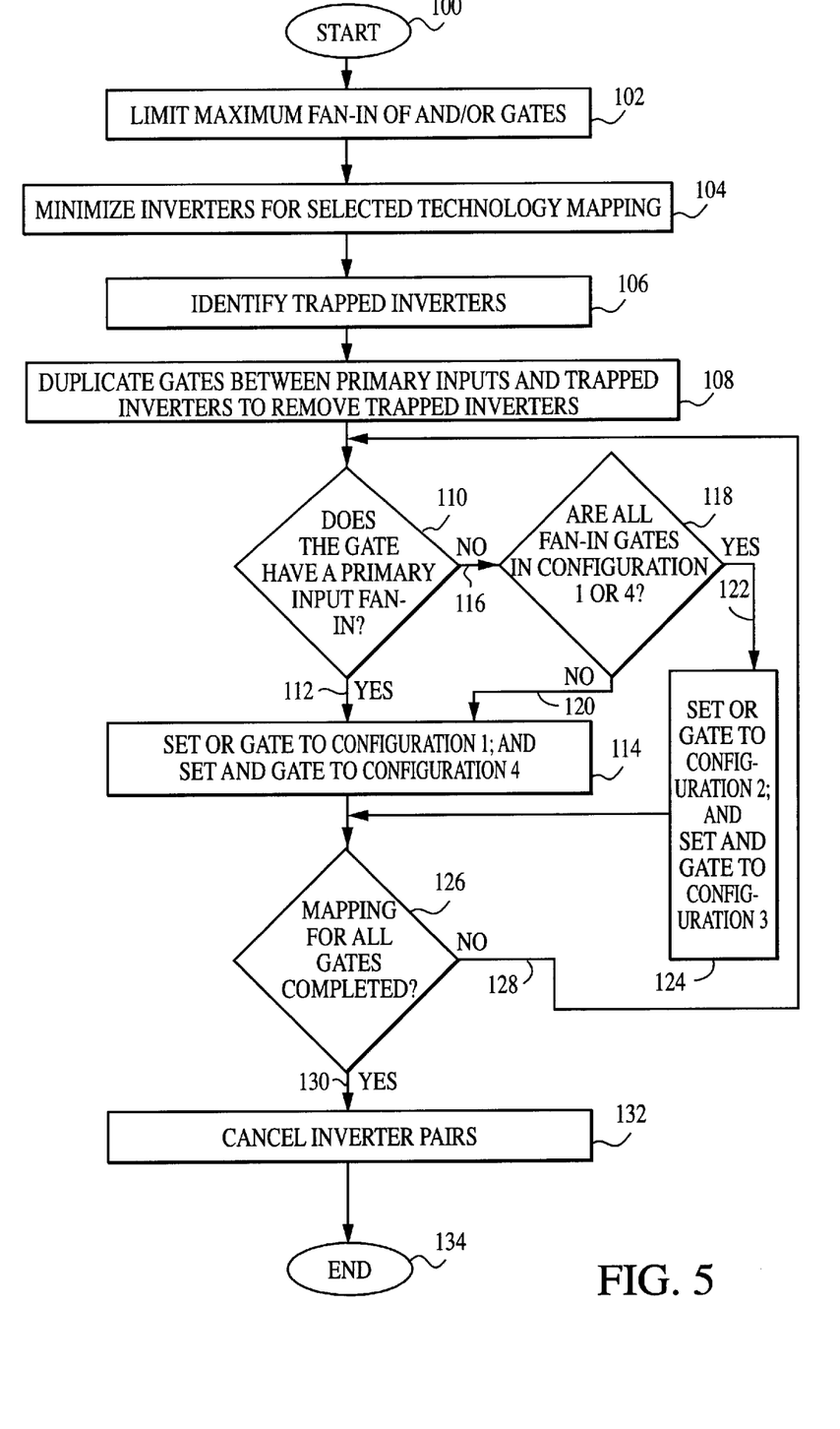
FIG. 5 is a flow chart illustrating the process of synthesizing a skewed static logic circuit.

FIG. 5 illustrates a flow chart for implementing the OR gate and AND gate technology mapping methodology of FIGS. 4(a)–(b) for minimizing inverters in a skewed static logic circuit design. The method is initiated at step 100 and proceeds to limit the maximum fan in of the AND/OR gates at 102. Next, Boolean logic cancellation techniques are applied to the circuit configuration to minimize the number of inverters for a selected technology mapping 104. After minimizing inverters 104, the trapped inverters in the circuit are identified 106. Trapped inverters are not capable of being initially minimized using Boolean logic cancellation techniques. To eliminate the trapped inverters, gates are duplicated between the primary inputs and the trapped inverters 108.

After duplicating gates 108, the method queries whether each gate of the circuit has a primary input fan in at step 110. For each gate that has a primary input fan in 112, the method sets any OR gates receiving the primary input fan in to a configuration 1 gate which has a high-low logic inverter fed into a low-high NAND gate 114 as illustrated in FIG. 4(a). The method also sets at step 114 any AND gates receiving a primary input fan in to a configuration 4 gate which has a high-low logic inverter fed into a low-high NOR gate as illustrated in FIG. 4(b). If a gate is determined to not have a primary input fan in 116, then the method queries whether all fan in gates are a configuration 1 gate or a configuration 4 gate at step 118. If the fan in gates are not 120 a configuration 1 gate or a configuration 4 gate, then the method proceeds again to step 114 and sets any OR gates to a configuration 1 gate and any AND gates to configuration 4 gate. If all the fan in gates are a configuration 1 gate or a configuration 4 gate 122, then the method sets at 124 any OR gates to a configuration 2 gate and any AND gates to a configuration 3 gate as illustrated in FIGS. 4(a)–(b).

After setting any OR and AND gates in steps 114 and 124, the method queries at step 126 whether mapping for all the gates is completed. If not 128, the method loops back to step 110 and again determines whether another gate has a primary input fan in. When mapping for all gates is completed 130, inverter pairs are canceled 132 to minimize the number of inverters in the skewed static logic circuit. The method then ends at 134.

Figure 6A:
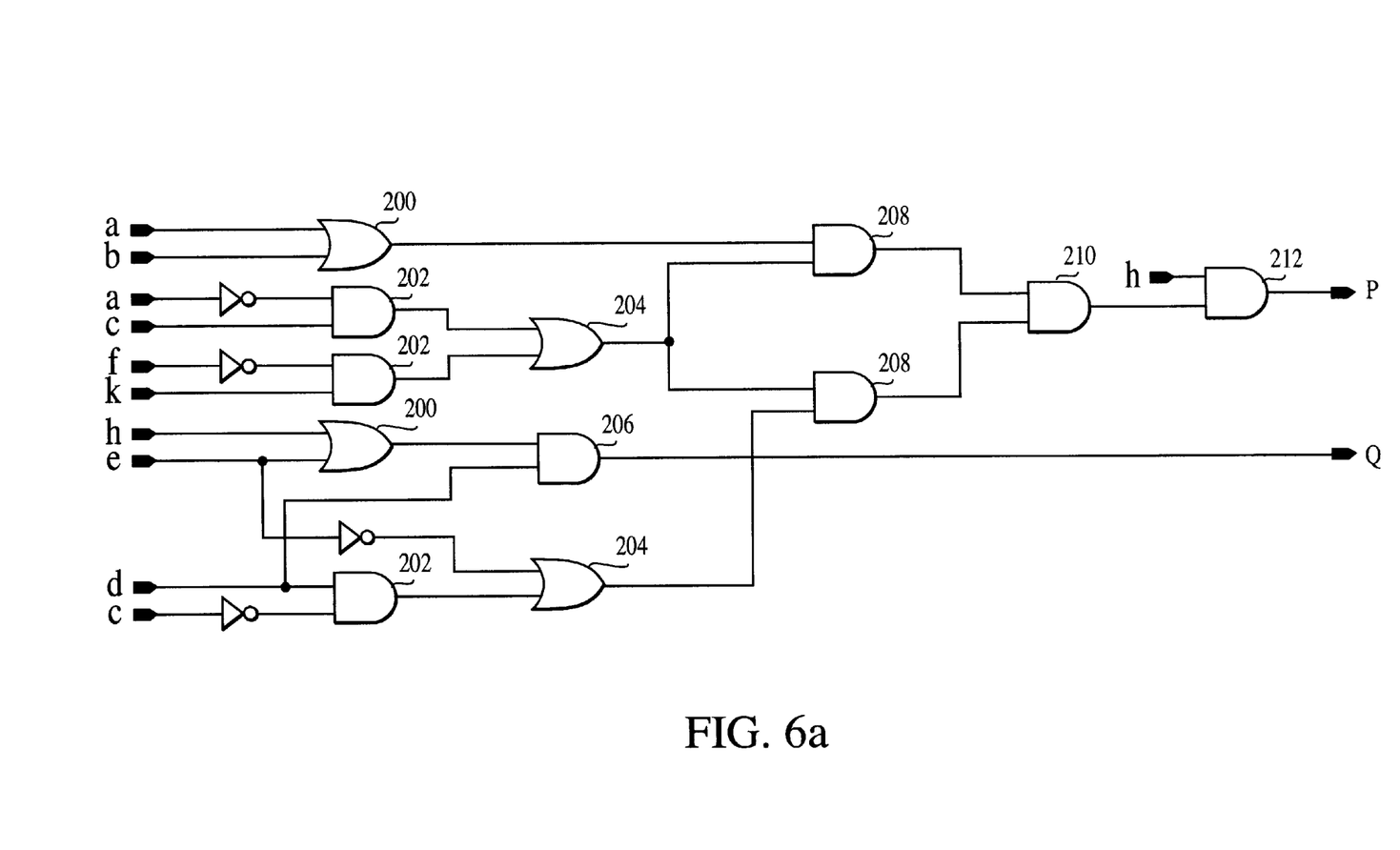
Figure 6B:
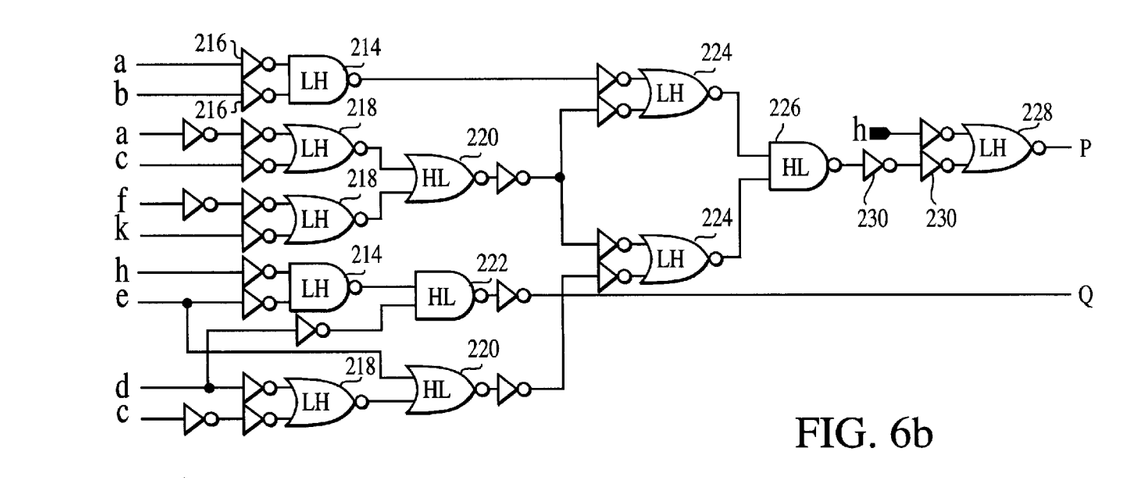
Figure 6C:
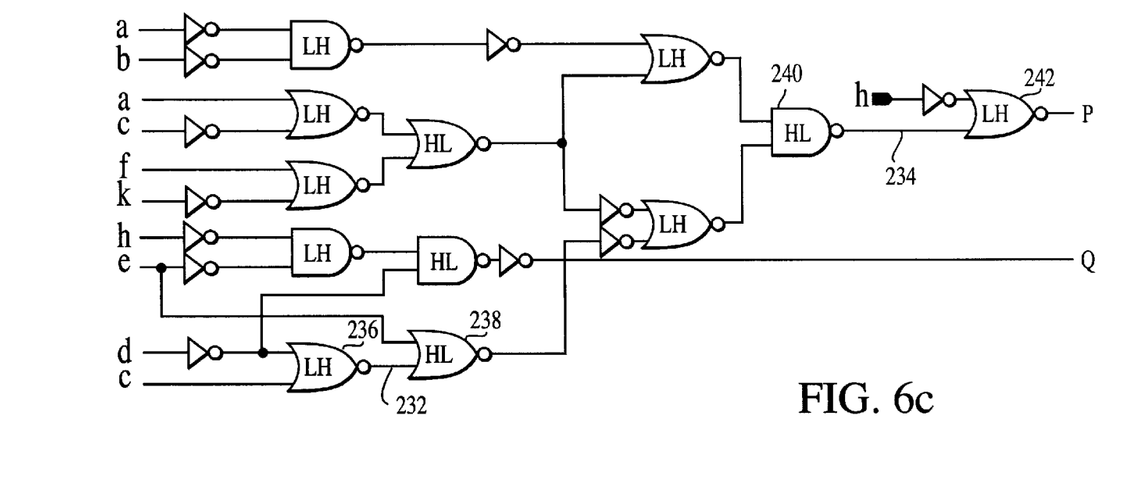

FIGS. 6(a)–(c) illustrate the mapping methodology for the exemplary circuit of FIG. 6(a) with a maximum fan in of two selected. As shown in FIG. 6(a), OR gates 200 and AND gates 202 each have a primary input fan in. Upon the mapping of these gates 200, 202, each will be converted into a configuration 1 gate or a configuration 4 gate. OR gates 204 and AND gate 206 do not have a primary input fan in since their input is received from either one of the primary input fan in OR gates 200 or AND gates 202. Similarly, AND gates 208, AND gate 210, and AND gate 212 do not have a primary input fan in. The circuit has output from gates that do not receive a primary input. That is, AND gate 212 provides a first circuit output P, and AND gate 206 generates a second circuit output that is inverted to provide output Q.

FIG. 6(b) illustrates the mapping of the gates of the circuit of FIG. 6(a). OR gates 200 having a primary input fan in are mapped to configuration 1 gates. Similarly, AND gates 202 also having a primary input fan in are mapped to configuration 4 gates. That is, inputs a, b and h, e which feed into the OR gates 200 are mapped into NAND gates 214 and inverters 216. Primary inputs a, c; f, k; and d, e which feed into the AND gates 202 of FIG. 6(a) are now fed into configuration 4 gates 218. OR gates 204 and the AND gate 206 have fan in gates 214, 218 that are configuration 1 or 4 gates. Therefore, these gates 204, 206 are mapped into configuration 2 gates 220 and a configuration 3 gate 222. The configuration 3 gate 222 provides circuit output Q.

Outputs from gates 220, 222 feed into AND gates 208. Since AND gates 208 have fan in gates that are not a configuration 1 or 4 gate, the AND gates are mapped into configuration 4 gates 224. Gates 224 feed into NAND gate 226 which is mapped into a configuration 2 gate based on the configuration 4 fan in gates inputted to the NAND gate. Similarly, AND gate 212 is mapped into a configuration 4 gate 228 based on the configuration 2 fan in gates to the AND gate, and provides circuit output P.

Upon completion of the mapping of the exemplary skewed static logic circuit of FIG. 6(a), inverter pairs such at inverters 230 can be canceled to provide the transferred circuit shown in FIG. 6(c) which has low power consumption and high-speed operation. In particular, the circuit of FIG. 6(c) has transitioning nodes, such as node 232 and node 234, that are transitioned by low-high (LH) gate 236 and high-low (HL) gate 238 or alternatively high-low gate 240 and low-high gate 242. Such transitioning is indicated for each gate in FIGS. 6(b) and (c). Transformed gates 214 and 224 which are both in LH configurations have an inverter therebetween to provide HL and LH gate coupling.

While a specific embodiment of the present invention has been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A CMOS skewed static logic gate, comprising:
   an evaluation path including a stacked set of low $V_t$ transistors;
   a set of higher $V_t$ output transistors being fed a first input to precharge an output of the CMOS skewed static logic gate; and
   a positive feedback accelerator circuit connected to the set of higher $V_t$ output transistors.

2. The CMOS skewed static logic gate of claim 1, wherein the positive feedback accelerator circuit comprises:
   positive feedback transistors connected to the output;
   a noise suppression transistor connected to the output; and
   a precharge transistor connected to the positive feedback transistors.

3. The CMOS skewed static logic gate of claim 2, wherein the precharge transistor is fed from a second input.

4. The CMOS skewed static logic gate of claim 2, wherein the positive feedback transistors comprise a loop connected to the output and the precharge transistor is connected to the loop.

5. The CMOS skewed static logic gate of claim 2, wherein the positive feedback transistors comprise higher $V_t$ output transistors.

6. The CMOS skewed static logic gate of claim 1, wherein the first input is a clock signal inputted to a gate of one of the set of higher $V_t$ output transistors connected in parallel.

7. A CMOS skewed static logic configuration, comprising:
   an accelerator circuit configured to receive an input signal and having an output node;
   means for evaluating the input signal to generate an output signal at the output node of the accelerator circuit; and means for precharging the output node of the accelerator circuit to generate an output signal.

8. The CMOS skewed static logic configuration of claim 7, wherein the means for evaluating the input signal further comprises a plurality of stacked low $V_t$ transistors.

9. The CMOS skewed static logic configuration of claim 7, wherein the means for precharging the output node of the accelerator circuit comprises one or more higher $V_t$ output transistors having a first input to precharge an output node of the accelerator circuit.

10. The CMOS skewed static logic configuration of claim 9, wherein the accelerator circuit further comprises positive feedback transistors connected to the output node.

11. The CMOS skewed static logic configuration of claim 10, wherein the accelerator circuit further comprises a noise suppression transistor connected to the output node.

12. The CMOS skewed static logic configuration of claim 11, wherein the accelerator circuit further comprises a precharge transistor connected to the positive feedback transistors.

13. The CMOS skewed static logic configuration of claim 9, wherein the first input signal is inputted to a gate of one of the one or more high $V_t$ transistors.

14. The CMOS skewed static logic configuration of claim 12, wherein the precharge transistors and the positive feedback transistors comprise high $V_t$ transistors.

15. The CMOS skewed static logic configuration of claim 12, wherein the noise suppression transistor prevents a voltage of the output node of the accelerator circuit from floating.

16. A method of synthesizing a CMOS skewed static logic configuration having primary inputs to generate a high-speed output signal, the method comprising the steps of:

limiting maximum fan in of the CMOS skewed static logic configuration;

minimizing inverters for a selected mapping methodology of the CMOS skew static logic configuration;

identifying trapped inverters;

duplicating gates of the CMOS skewed static logic configuration between the primary inputs and the trapped inverters;

transforming the gates of the CMOS skewed static logic configuration based on inputs to the gates; and canceling pairs of inverters in series with one another.

17. The method of claim 16 wherein the step of transforming the gates of the CMOS skewed static logic configuration according to inputs to the gates further comprises:

determining if a gate has a primary input fan in, and if so:
transforming an OR gate to a transformed OR gate comprising a high-low inverter fed into a low-high NAND gate; and
transforming an AND gate to a transformed AND gate comprising a high-low inverter fed into a low-high NOR gate.

18. The method of claim 17, wherein upon a determination that the gate does not have a primary input fan in the method further includes the steps of:

determining if fan in to the gate is one of a transformed OR gate and a transformed AND gate, and if so:
transforming an OR gate to a high-low NOR gate fed into a low-high inverter; and
transforming an AND gate to a high-low NAND gate fed into a low-high inverter.

19. The method of claim 18, wherein upon a determination that fan in to the gate is not one of a transformed OR gate and a transformed AND gate, the method further includes the step of transforming the gate to one of the transformed OR gate and the transformed AND gate.

* * * * *